(12) United States Patent  
Summers (10) Patent No.: US 8,558,364 B2  
(45) Date of Patent: Oct. 15, 2013

(54) INDUCTIVE GETTER ACTIVATION FOR HIGH VACUUM PACKAGING

(75) Inventor: Jeffery F. Summers, Santa Barbara, CA (US)

(73) Assignee: Innovative Micro Technology, Goleta, CA (US)

(*) Notice: Subject to any disclaimer, the term of this patent is extended or adjusted under 35 U.S.C. 154(b) by 87 days.

(21) Appl. No.: 13/137,883

(22) Filed: Sep. 20, 2011

(65) Prior Publication Data

US 2012/0068300 A1    Mar. 22, 2012

Related U.S. Application Data

(60) Provisional application No. 61/344,725, filed on Sep. 22, 2010.

(51) Int. Cl.
*H01L 23/20* (2006.01)

(52) U.S. Cl.
USPC .... 257/682; 257/680; 257/787; 257/E23.124; 445/24; 445/25; 445/26; 445/27; 445/28; 445/29; 445/30; 445/31; 219/634

(58) Field of Classification Search
USPC .......... 257/E23.124, 787, 680, 682; 219/634; 445/24–31
See application file for complete search history.

(56) References Cited

U.S. PATENT DOCUMENTS

| 6,042,443 | A  | * | 3/2000  | Carella et al. ............. 445/24 |
| 7,508,132 | B2 | * | 3/2009  | Chen et al. ............... 313/553 |
| 7,569,926 | B2 |   | 8/2009  | Carlson et al. |
| 7,687,304 | B2 |   | 3/2010  | Carlson et al. |
| 7,785,913 | B2 |   | 8/2010  | Foster et al. |
| 7,960,208 | B2 |   | 6/2011  | Carlson et al. |
| 7,968,986 | B2 |   | 6/2011  | Hovey et al. |
| 2003/0006703 | A1 | * | 1/2003 | Yonezawa et al. .......... 313/553 |
| 2003/0010775 | A1 | * | 1/2003 | Kim ......................... 219/634 |

OTHER PUBLICATIONS

"A Low Voltage Push-Pull SPDT RF MEMS Switch Operated by a Combination of Electromagnetic Actuation and Electrostatic Hold," Il-Joo Cho, et al., IEEE Transactions, pp. 32-35, May 5, 2005.
U.S. Appl. No. 11/211,622, filed Aug. 26, 2005, Carlson et al.
U.S. Appl. No. 11/819,338, filed Jun. 27, 2007, Summers et al.
U.S. Appl. No. 11/797,924, filed May 9, 2007, Foster et al.

* cited by examiner

*Primary Examiner* — Matthew E Warren
*Assistant Examiner* — David Chen
(74) *Attorney, Agent, or Firm* — Jacquelin K. Spong (57) ABSTRACT

An approach to activating a getter within a sealed vacuum cavity is disclosed. The approach uses inductive coupling from an external coil to a magnetically permeable material deposited in the vacuum cavity. The getter material is formed over this magnetically permeable material, and heated specifically thereby, leaving the rest of the device cavity and microdevice relatively cool. Using this inductive coupling technique, the getter material can be activated after encapsulation, and delicate structures and low temperature wafer bonding mechanisms may be used.

17 Claims, 7 Drawing Sheets

INDUCTIVE GETTER ACTIVATION FOR HIGH VACUUM PACKAGING

CROSS REFERENCE TO RELATED APPLICATIONS

This application claims priority to U.S. Provisional Patent Application No. 61/344,725, filed Sep. 22, 2010, and incorporated by reference in its entirety.

STATEMENT REGARDING FEDERALLY SPONSORED RESEARCH

Not applicable.

STATEMENT REGARDING MICROFICHE APPENDIX

Not applicable.

BACKGROUND

This invention relates to a microdevice enclosed in an evacuated cavity.

Deposition techniques for thin layers used in semiconductor and MEMS devices often have gases incorporated in the layers during deposition. These devices may then be encapsulated in an evacuated cavity for proper functioning. However, the gases incorporated in the films may escape from the layers during the devices' lifetimes, raising the pressure in the evacuated cavities. Accordingly, many designs include a "getter" material, a reactive, generally metal layer, whose purpose is to absorb these gases, and maintain the vacuum levels within the package. Because of the reactive nature of these materials, they also tend to oxidize at the surface, forming an oxide layer that must be removed in order to activate the getter.

Current packaging techniques for vacuum-encapsulated packages require high temperatures, in excess of 400 centigrade, to activate the getters. At this temperature, the oxide layers are generally driven into the bulk of the getter material, leaving the surface relatively clean and able to absorb additional impurity gases. These temperatures are consistent with those required to fuse glass frit, which is often used for vacuum encapsulation, because the melting temperatures simultaneously fire, or activate, the getter.

However, these high temperatures are incompatible with many of the materials and structures included in these devices, which cannot withstand these temperatures without melting or evaporating. Thus, the encapsulation of many small, delicate devices in a sealed vacuum cavity remains an unresolved problem, because there is presently no way to activate the getter without exposing the devices to high (>400 centigrade) temperatures.

SUMMARY

Proposed here is activation of getter after packaging the device with a low temperature bonding process (e.g., indium). The getter is fired or activated by depositing the getter material over a magnetically permeable material like iron (Fe), nickel-iron permalloy (NiFe), cobalt (Co), neodymium (Nd) or similar permeable magnetic material. The magnetic, getter materials may be either be suspended over an empty cavity or deposited over an insulating layer.

The getter would be fired by placing the die or wafer in or near an RF coil and inductively heating the magnetic material. The coil generates and alternating magnetic field within the coil or along its axis. The field lines of this alternating field are then gathered within the permeable magnetic material as is well known from magnetostatics. The alternating field within the magnetically permeable material generates an alternating current within the magnetically permeable material, which in turn, heats the magnetically permeable material by Joule heating.

Because the getter is deposited over the magnetic material and is in direct contact with the magnetically permeable material over much of its surface, the heat would flow by conduction specifically into the getter material, heating it preferentially to the rest of the device, which would remain at a relatively low temperature. To increase the efficiency of this heat transfer, the magnetic material may be suspended over a cavity or void formed beneath it, reducing the heat leakage into the substrate thereby.

Several embodiments of this idea are described below, as examples of the inventive concept.

BRIEF DESCRIPTION OF THE DRAWINGS

Various exemplary details are described with reference to the following figures, wherein.

DETAILED DESCRIPTION

The systems and methods described herein may be particularly applicable to the manufacture of microdevices, wherein the manufacturing process makes use of a low temperature bonding methodology, such as a metal alloy bond. The microdevices may be, for example, MEMS devices formed on a semiconductor substrate. Alternatively, they may be integrated circuit devices formed on a semiconductor substrate.

As mentioned previously, most vacuum encapsulated devices have used a glass frit adhesive to bond two substrates together, wherein the substrates define an evacuated device cavity in the wafer assembly that encloses a microdevice. The glass frit provides a hermetic seal around the device cavity, maintaining the vacuum therein. However, glass frit requires high melting or bonding temperatures, which may destroy the delicate structures of the microdevice. These high temperatures are also needed to activate the getter enclosed in the device cavity. Therefore, if using a lower temperature bonding method, some other means must be devised for activating the getter which requires the higher temperatures.

Many devices and especially so-called microelectromechanical systems (MEMS) devices, have delicate structures which cannot withstand these 400+ degree centigrade temperatures. For these devices, a lower temperature bond may be used, for example, a metal alloy bond such as that described in U.S. patent application Ser. No. 11/211,622, filed Aug. 26, 2005 and U.S. patent application Ser. No. 11/304,601, now U.S. Pat. No. 7,569,926. Each of these documents is incorporated by reference in their entireties. For such applications, the getter must be fired some other way than raising the temperature of the wafer assembly to 400+ degrees centigrade. Furthermore, the getter must be activated within a vacuum cavity, for example within the wafer bonding chamber, and that vacuum maintained in order to avoid the reformation of the passivation layer over the getter surface. This may be done by, for example, heating the lid wafer only within an evacuated bonding chamber, and then bonding the lid wafer to the device wafer in the bonding chamber. However, the bonding material is generally already placed on the lid wafer before insertion in the bonding chamber, thus requiring a bonding technology to withstand the high temperatures. If a low temperature metal alloy bonding material is used on the lid wafer, these metal films may be melted, damaged or degraded by the heat.

Accordingly, to date, there has been no way of using a low temperature bond with a device requiring a getter, which has greatly inhibited the development of such devices. There are, indeed, many such devices such as infrared imaging devices or bolometers, which because of their need for an evacuated operating environment, require getters, but their delicate structures cannot withstand high temperatures, and thus they require a low temperature bond.

The problem may be addressed by applying the heat locally and specifically, using the techniques described herein. This technique is consistent with bonds that may be formed at low temperature, for example using metal alloy bonds as described in the '926 patent. These materials form a hermetic seal at temperatures less than about 250 degrees centigrade.

The system makes use of an inductively coupled, magnetically permeable layer disposed on a substrate and directly beneath and in direct contact with an overlying getter layer. It should be understood that any conductive material will generate eddy currents, but this effect can be greatly amplified by using a permeable magnetic material, which effectively amplifies the magnetic flux. Furthermore, because metal materials will all respond similarly, using a permeable material allows heating of that material preferentially, leaving other conductive structures relatively unaffected. This magnetically permeable material is inductively coupled to an external RF coil which generates an RF changing magnetic field. The changing field generates eddy currents in the magnetic material, which heats the material by Joule heating. The heat thus produced in the magnetic layer may be isolated from the underlying substrate by a void or cavity, thus minimizing the flow of heat into this heat sink and restricting it largely to the magnetic layer. The heat is the transferred by conduction to the overlying getter layer, heating and thus activating the getter. Because the heat is isolated to the magnetic and getter layers, the remainder of the wafer and device may remain relatively cool. The technique may be applied to enacpasulated, singulated, individual devices, or it may be applied to the entire wafer before or after bonding.

Figure 1:
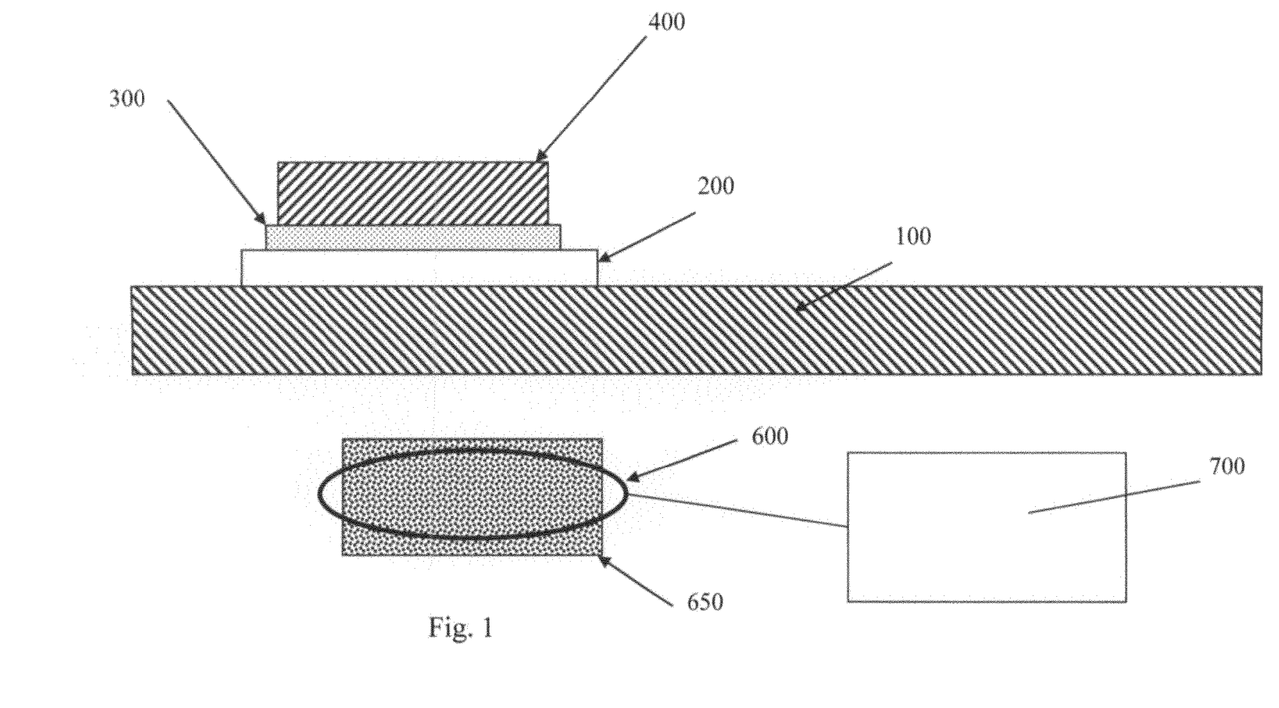
FIG. 1 is a cross sectional diagram of the magnetic getter firing approach.

FIG. 1 is a cross sectional view of a portion of the system and method. A supporting substrate 100 will be used to support the structure. Substrate 100 may be silicon, glass, ceramic, or any other convenient material that is consistent with lithographic processing. An insulating material 200 may be deposited or formed over the substrate 100. The insulating material may serve as electrical isolation between the conductive magnetic material and the possibly conductive substrate 100. The insulating material 200 may be, for example, an oxide such as a layer of silicon dioxide grown or deposited over the surface of a silicon substrate 100.

A magnetic material 300 is then formed or otherwise deposited over the insulator 200. The magnetic material may be, for example, iron (Fe), nickel (Ni), cobalt (Co), neodymium (Nd) and manganese (Mn), or their compounds, such as nickel-iron permalloy (80% Ni, 20% Fe). This layer may be deposited by, for example, sputter deposition to a thickness of several microns. The preferred thickness will depend on the details of the application, such as the amount of heat required to fire the getter, its thickness and extent, and the rate of heat loss to surrounding areas and structures. In one embodiment, the magnetic layer is preferably about 3 um thick, but may be anywhere from 0.5 to 20 um thick, and may depend on the size of the device cavity. Preferably, this material 300 may have a permeability of between about 1 T to 20 T.

Although in theory, any conductive material would respond to the changing magnetic field, use of the magnetically permeable material may amplify the field strength, and thus the magnitude of the eddy current, by many fold, and is thus preferred.

The getter material 400 may then be deposited over the magnetic material 300. The getter material is typically a reactive metal or metal alloy, such as, for example, an alloy of zirconium (Zr), vanadium (V), and iron (Fe) as that described in U.S. patent application Ser. No. 11/819,338, incorporated by reference in its entirety. The getter material 400 may be deposited over the entire surface of the wafer, or it may be localized to certain areas by patterning. This patterning step may pattern the underlying magnetic layer at the same time. The getter material may be 0.2-3 microns thick and extend over about a 3-4 micron area As described previously, the getter material 400 may be fired, that is, activated, by heating the getter material 400 to a temperature at which its passivation layer is driven off. Typically, this passivation layer is an oxide which forms over the surface of the getter material 400 when the getter material 400 is exposed to an atmosphere. The temperatures required for activation depend on the material, but are typically several hundred degrees Centigrade. For the zirconium/vanadium alloy mentioned above, this temperature may be about 450 centigrade. Using the method described here, this temperature may be achieved in the getter material 400, while the rest of the structure remains relatively cool.

A power supply 700 is used to generate an RF signal which is applied to a coil 600 as shown in FIG. 1. The signal generates a changing magnetic field along its axis, as is well known from fundamental electromagnetism. This changing field then couples into the magnetically permeable material 300, driving eddy currents in the magnetically permeable material 300. The power dissipated by the eddy currents is proportional to the square of the flux density within the material, thus having the material be magnetically permeable greatly improves the efficiency of this approach. These eddy currents may then heat the material through simple Joule heating. The magnitude and frequency of the RF signal needed to heat the getter to 450 centigrade may be about 200 W and 40 kHz. It should be understood that these values are exemplary only, and the values used in a particular application may depend on the details of that application. Values in the range 1 W-100 W and 1 kHz-100 kHz may be appropriate, or any other values sufficient to heat the getter enough to activate its surface are anticipated.

The coil may also be wrapped around a core of permeable magnetic material 650 which will also dramatically increase the magnetic flux produced. This core 650 may be, but need not necessarily be, the same material as magnetically permeable material 300. A core permeability of between about 10 and 20 T may be suitable. This core may be a composition including iron (Fe), nickel (Ni), cobalt (Co), neodymium (Nd), manganese (Mn) or their alloys. The coil may be brought into proximity to the magnetic layer, but need not be in contact or coupled to the wafer either mechanically or electrically. The coil may be conveniently brought to a distance of about 1 cm to the magnetic layer, or even closer. Upon energizing the coil, the temperatures in the magnetic layer may rise rapidly, activating the getter within minutes or even seconds. Since the getter is already enclosed in the evacuated device cavity, it begins functioning immediately, and no further processing is needed. The wafer can then be singulated if it has not yet been diced.

Figure 2:
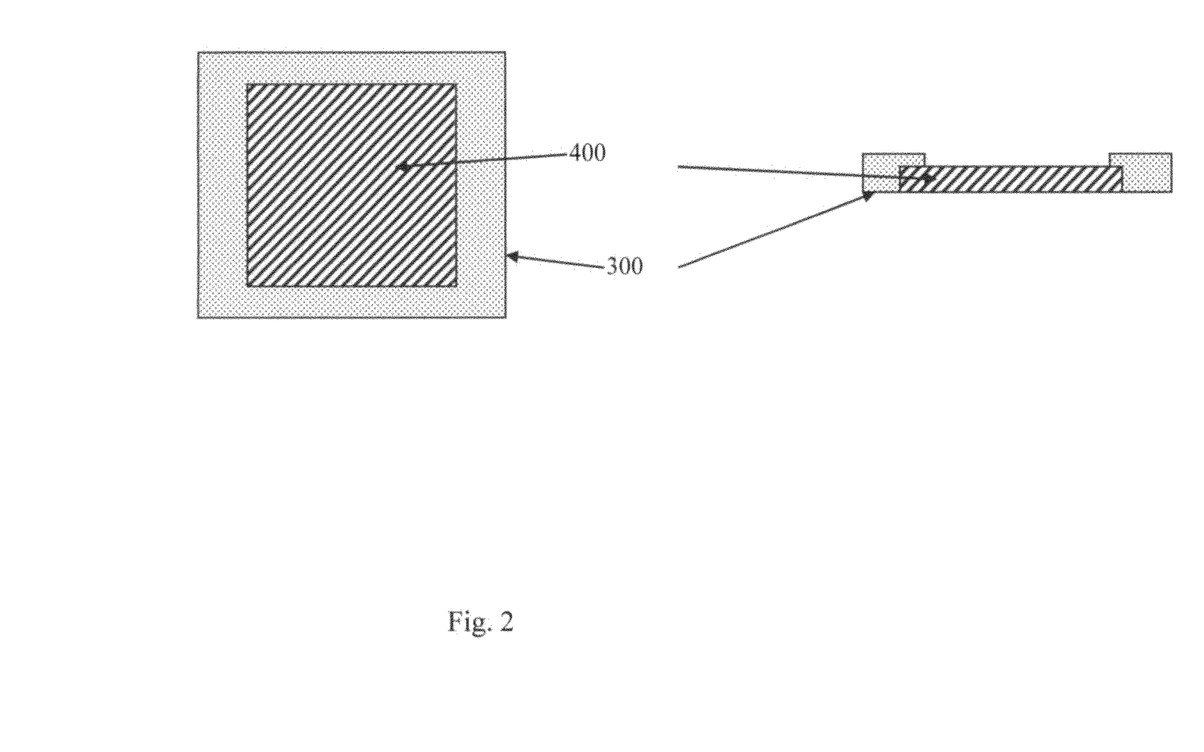
FIG. 2 is a cross sectional diagram of an alternative magnetic getter firing approach.

FIG. 2 is a plan view diagram of the device shown in FIG. 1. As shown in FIG. 2, the dimensions of the magnetic layer 300 may exceed those of the getter layer 400, so that the magnetic layer 300 may be in the form of a picture frame around the getter layer 400. This may assure that the edges of the getter layer 400 are effectively activated, as well as the interior regions. The amount of overhang need not be large, for example a fraction of a micron may be sufficient, in the range 0.1-1.0 um.

RF inductive heating is well known, but to the inventor's knowledge, has yet to be used to fire a getter within a device cavity. The silicon and most materials in MEMs devices are non-magnetic so this process is effective on the magnetic material but does not affect or heat any other structure. The process can be used for any discrete or wafer-level device that is not packaged in a magnetic material, which includes the vast majority of microdevices.

The getter material may not necessarily be formed using a thin film deposition techniques. Instead, it could be formed by silk screening, spraying or other methods. The getter material may be deposited in bead form, packed into the cavity, with a very large resulting surface area, giving it almost unlimited pumping capacity.

Figure 3:
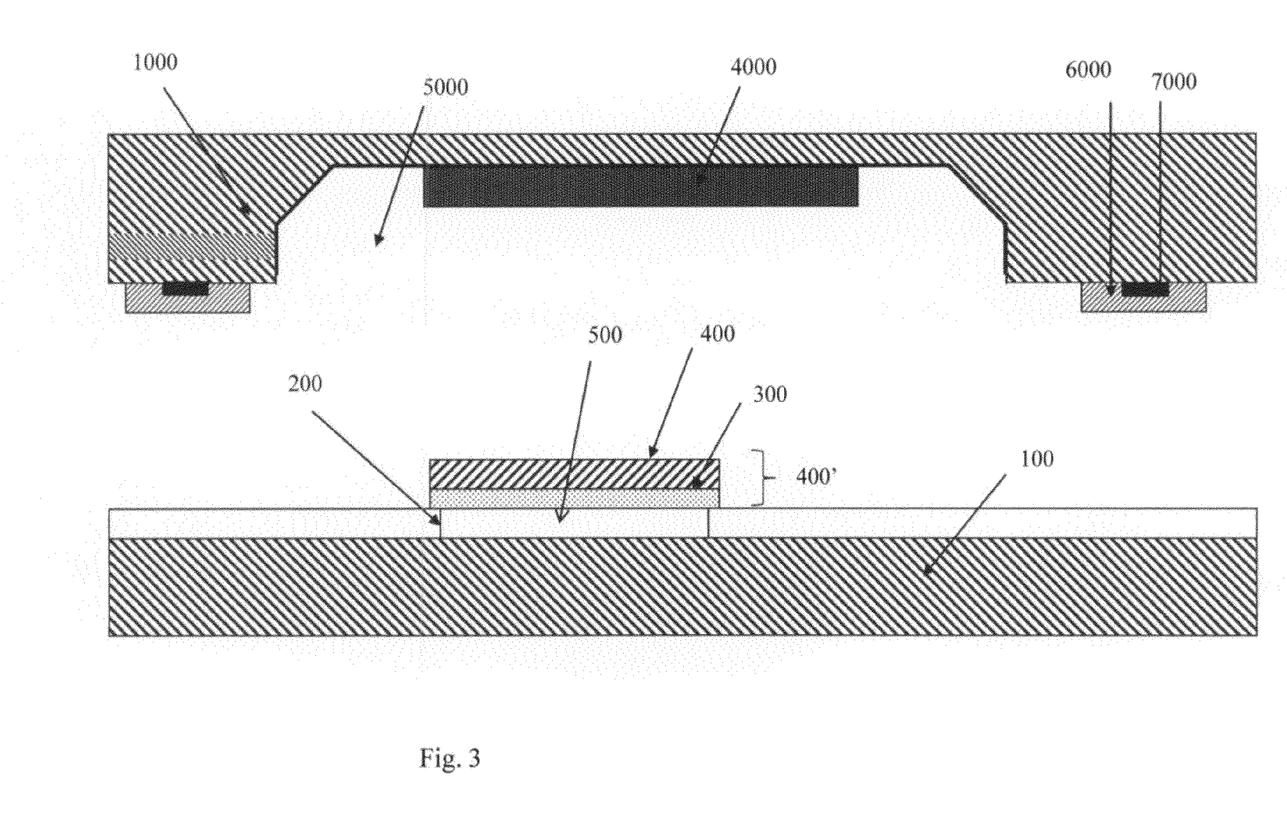
FIG. 3 is a cross sectional diagram of an alternative magnetic getter firing approach.

FIG. 3 shows the application of this technique to the packaging of a microdevice 4000 in an evacuated device cavity 5000 with a getter 400. The microdevice may be, for example, a switch such as that described in U.S. patent application Ser. No. 11/797,924 filed May 9, 2007 and incorporated by reference in its entirety. The metal layers of this device may be unable to withstand the temperatures needed for glass frit bonding. Alternatively, the device may be an infrared emitting or infrared detecting device such as that described in U.S. Pat. No. 7,687,304 or U.S. Pat. No. 7,968,986, both incorporated by reference in their entireties, and assigned to the same assignee as the present invention.

Accordingly, a low temperature bond may form a sealed vacuum cavity that encloses a microdevice. Suitable low temperature bonds are described in the incorporated '622 and '601 applications.

The device wafer 1000 or the lid wafer 100 may have the low temperature bonding material 6000 formed in a perimeter around the microdevice 4000. This bonding material may be combined with a raised feature 7000 as is described more fully in U.S. Pat. No. 7,569,926 and U.S. Pat. No. 7,960,208, incorporated by reference in their entireties, and assigned to the same assignee as the instant application. After bonding the lid wafer 100 to the device wafer 1000 in an evacuated bonding chamber, the wafer assembly may be removed from the bonding chamber. The getter material 400, now encapsulated in the device cavity 5000 with the microdevice 4000, may be activated as described above. The getter may be fired using this inductive procedure either before or after bonding the lid wafer to the device wafer, but to avoid installing the coil in the bonding chamber, the getter material may be activated after bonding to the device wafer and removal from the bonding chamber. The process may be conducted on either individual devices after singulation, or on the entire wafer before singulation. As shown in FIG. 3, a cavity 500 may be formed under the magnetic layer 300, by etching away the insulating layer 200 in this region. The cavity may be devoid of solid material under a substantial portion of a surface of the magnetic layer 300. This "substantial portion" may be, for example, 75% or more of the surface of the magnetic layer. This cavity may be evacuated during wafer bonding and subsequent getter activation. The presence of the cavity 500 beneath the magnetic layer may provide thermal isolation to the magnetic layer, such that the heat generated in the magnetic layer 300 is available for firing the getter layer 400, rather than being drawn into the thermal sink of the substrate 100. The cavity 500 may be formed by wet etching, for example, by applying an etchant such as potassium hydroxide (KOH) to the insulation layer 200 and etching the cavity in the insulation layer 200. Various techniques for performing such etching are described further below with respect to FIGS. 5 and 6.

Figure 4:
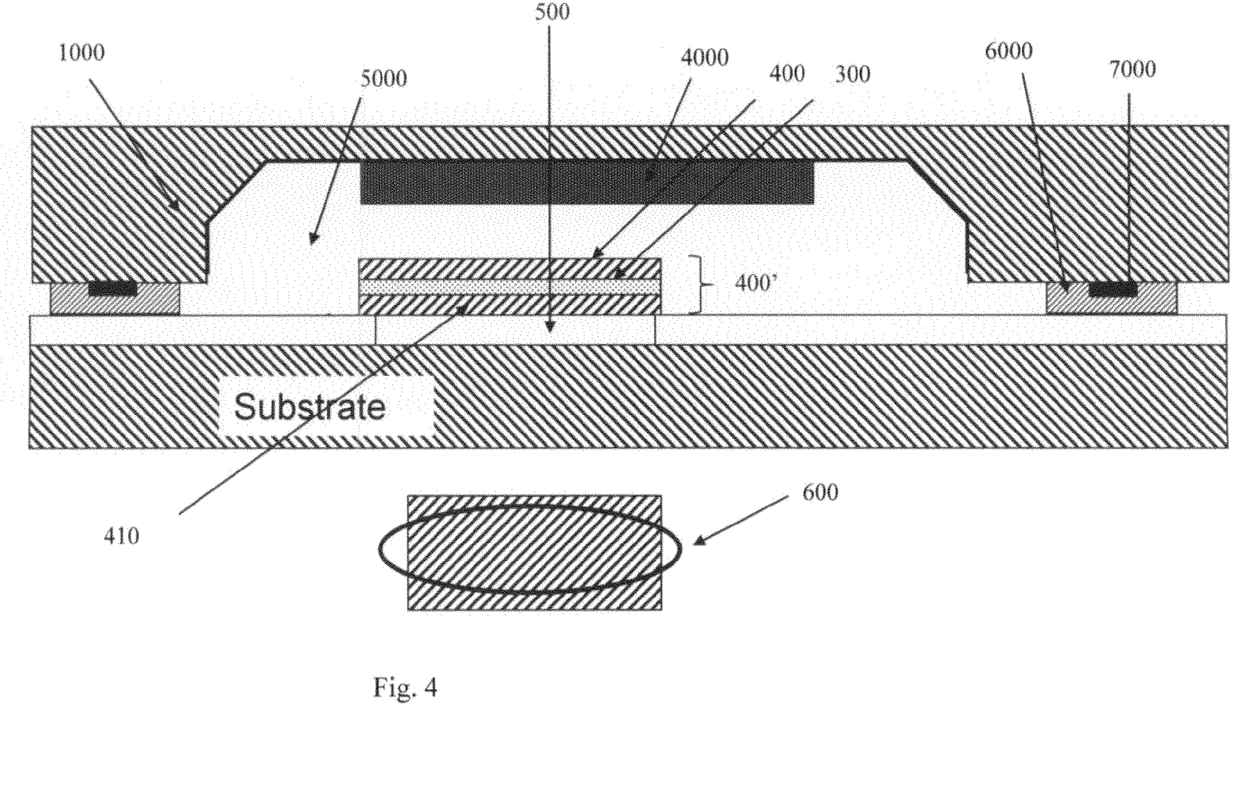
FIG. 4 is a plan view of the magnetic getter firing approach.

FIG. 4 shows another embodiment of the concept described above. In this embodiment, a first layer of getter material 410 is deposited before the magnetic material 300. The magnetic material 300 is then deposited as before. A second layer of getter material 400 is then deposited over the magnetic material 300 as in the previous embodiment. The multilayer stack 300-410, now referred to as 400', may then be patterned. A cavity 500 may then be formed beneath the stack 400' by any of the techniques described below with respect to FIGS. 5 and 6. By properly forming the cavity 500 beneath the multilayer stack 400', two surfaces of getter material, layers 410 and 400, are now in fluid communication with the device cavity 5000. As before in FIG. 3, the cavity 500 may be devoid of solid material under a substantial portion of a surface of the magnetic layer 300. This "substantial portion" may be, for example, 75% or more of the surface of the magnetic layer. The cavity 500 thus exposes the surface of the lower getter layer 410 to the environment of the device cavity 5000, thereby approximately double the gettering capability within the device cavity.

Figure 5:
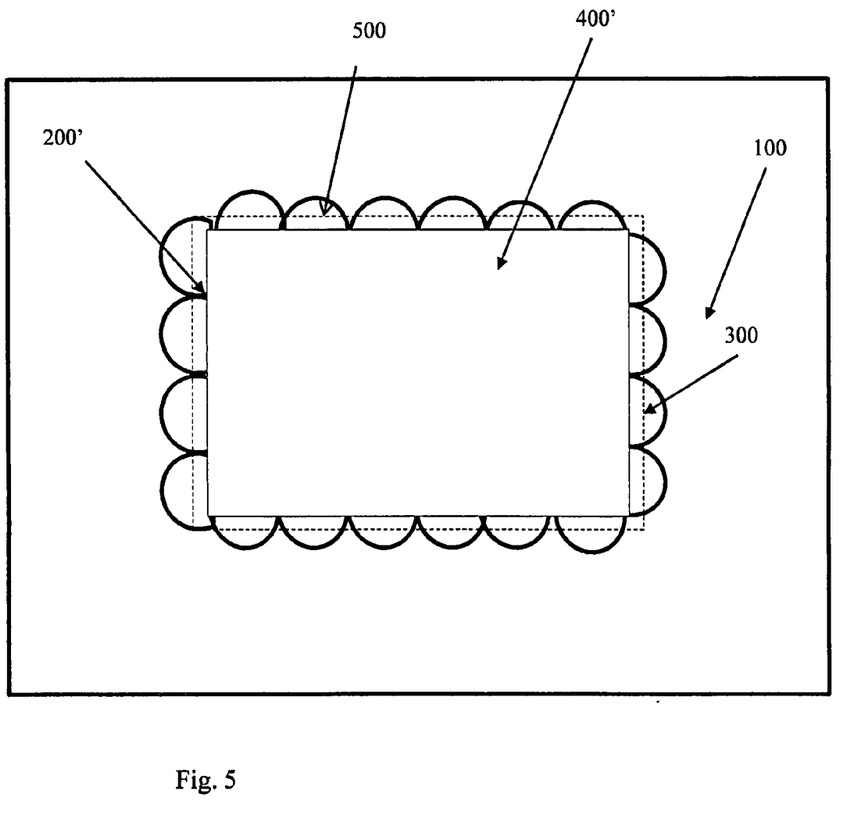
FIG. 5 is a plan view of an alternative embodiment of the magnetic getter firing approach.

FIG. 5 is a simplified plan view of one approach to implementing the multilayer stack 400' over a cavity 500 in fluid communication with device cavity 5000, as was shown in FIGS. 3 and 4. The insulating layer, having been formed uniformly over the surface of the substrate 100, is patterned with an outline of areas to be removed. For example, a hard mask may be patterned to cover areas of the insulating layer which are to be maintained, and then uncovered in areas to be removed. Reference number 200' now corresponds to the boundary of the insulating layer after patterning. This boundary may have an extent that partially underlies the magnetic layer, such that it can provide support to the overlying magnetic and/or getter layer. For example, the clamshell pattern shown in FIG. 5 may be used, such that narrow projections 200' of the insulating layer remain under the magnetic layer 300 or getter layer 400, in order to provide support for these structures. The magnetic layer 300 and getter layer 400 are thus freely suspended over much of the area of the cavity 500. However, these projections may be narrow, and not impede to any meaningful degree the passage of gases into and out of the cavity 500. The clamshell pattern shown in FIG. 5 is but one example of such an outline. As this outline is lithographically formed, it may be formed in any arbitrary or complex shape. The cavity 500 may be formed by allowing a liquid etchant, such as potassium hydroxide (KOH) to be applied to the areas not covered by the hard mask. The cavity may be formed after the magnetic layer 300 and getter layer 400 are formed in the regions shown, and the liquid etchant may be introduced to the cavity through the remaining holes 200'.

Figure 6:
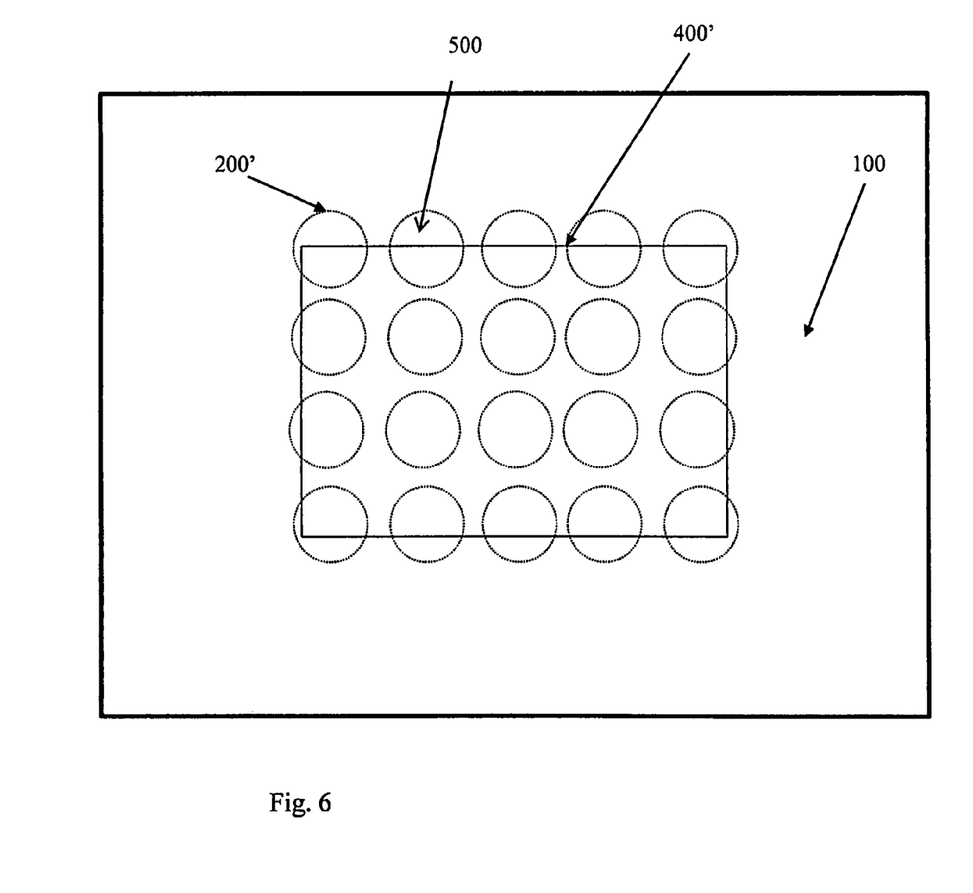
FIG. 6 is a plan view of an alternative embodiment of the magnetic getter firing approach.

Another example of a similar approach is shown in FIG. 6. FIG. 6 is a simplified plan view of the insulating layer 200 in which an array of holes 200' has been lithographically formed. The holes may allow alloy an etchant to be introduced which will remove substrate material 100 beneath and between the holes. Additional detail directed to this approach is disclosed in U.S. Pat. No. 7,785,913, which is assigned to the same assignee as the present application. By providing a sufficient amount of time for the etchant to remove the substrate material 100, the removal will leave a cavity 500 beneath and between the holes which allows the free flow of gases to this region. The formation of this cavity 500 thus allows exposure of the lower getter layer 410 to the environment of the device cavity 5000. The lands between the holes 200' provide support to the overlying layers of magnetic and getter materials.

Although these two embodiments are but two of a large number of possible approaches to achieving the support of the getter material in a multilayer a stack 400', while allowing exposure of the stack 400' to the environment of the device cavity 5000. Each of these approaches has at least a portion of material that supports an overlaid material suspended over a cavity 500. The environment of the cavity 500 is in fluid communication with the device cavity 5000 that encapsulates the device.

Figure 7:
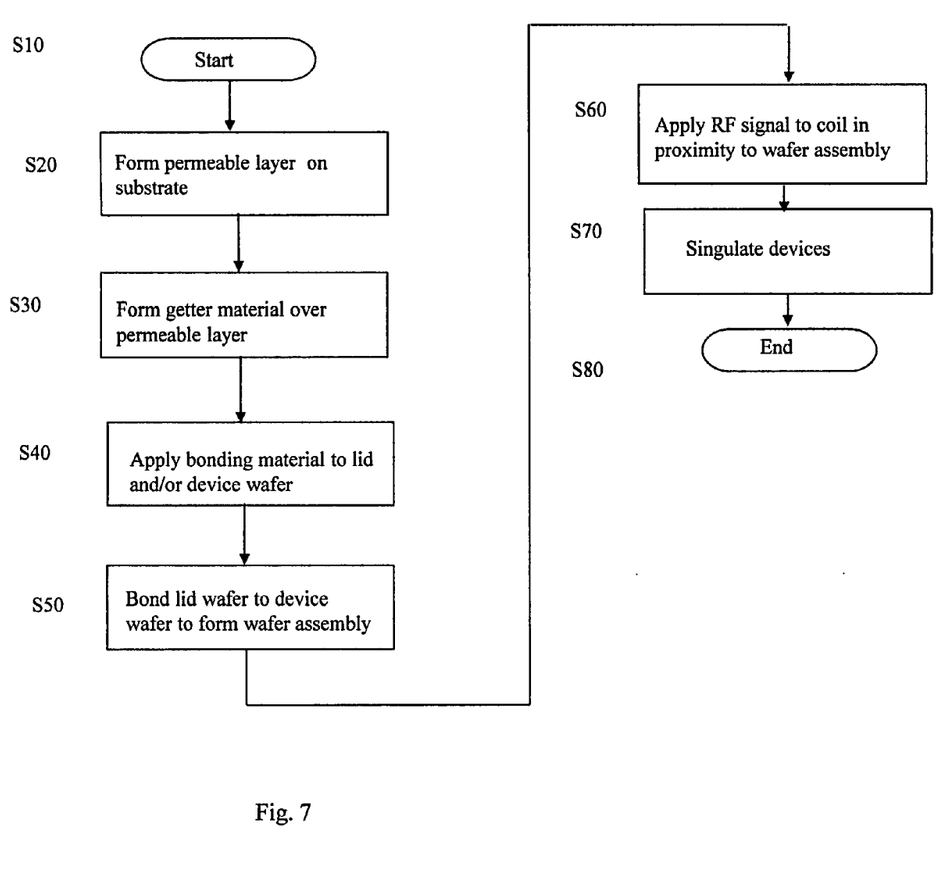
FIG. 7 is flow diagram of a magnetic getter firing method.

FIG. 7 is a flow chart illustrating one method of practicing the system and method described herein. The process begins in step S10. In step S20, a magnetically permeable layer is deposited over a substrate. In step S30, a getter layer is deposited over the magnetically permeable layer. In step S40, a bonding material is deposited on the device wafer and/or lid wafer. In step S50, the lid wafer is bonded to the device wafer. In step S60, an RF signal is provided to a coil to produce a changing magnetic field, which heats the overlying getter material, activating its surface. In step S70, the encapsulated devices are singulated to separate them from the wafer. The process ends in step S80.

It should be understood that this process is exemplary only, and that steps can be added or omitted, or performed in a different order that that shown without deviating from the scope of this invention. For example, the devices may be singulated before applying the RF field to activate the getter. Or the devices need not be singulated at all. Additional layers may be provided in addition to the two specified in the process shown in FIG. 7, such as the multilayer stack described with respect to FIG. 4, above. The layers may be patterned after formation in steps S20 and S30. A cavity may also be formed below the magnetic layer in order to thermally isolate the magnetic layer from the substrate before the lid wafer is bonded to the device layer in step S50.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. Furthermore, details related to the specific methods are intended to be illustrative only, and the invention is not limited to such embodiments. It should be understood that the techniques disclosed herein may be applied to any microdevice, including integrated circuits, which may require a vacuum cavity with a getter enclosed therein, for proper functioning. The techniques may also be combined with other wafer bonding technologies, such as fusion bonding rather than metal alloy or glass frit bonding. Accordingly, the exemplary implementations set forth above, are intended to be illustrative, not limiting.

What is claimed is:

1. A method for activating a getter, comprising:
   forming a magnetically permeable material on a first substrate;
   forming a cavity disposed in the first substrate under the magnetically permeable material, wherein the cavity is devoid of solid material under a substantial portion of a surface of the magnetically permeable material;
   forming a first layer of getter material over the magnetically permeable material;
   forming a microdevice on a surface of either the first substrate or a second substrate;
   providing a coil which is not mechanically or electrically coupled to the first substrate;
   applying an RF signal to the coil;
   heating the magnetically permeable material by inductive coupling to the coil; and
   heating the getter material by thermal conduction from the magnetically permeable material, to a temperature sufficient to activate a surface of the getter material for gettering.

2. The method of claim 1, further comprising:
   encapsulating the microdevice in a device cavity defined between the first and second substrates, wherein the device cavity is in fluid communication with the surface of the getter material.

3. The method of claim 2, wherein the device cavity is formed by bonding the first substrate to the second substrate with a low temperature bond, which adheres surfaces of the substrates with a hermetic seal at temperatures less than about 250 degrees centigrade.

4. The method of claim 2, further comprising:
   forming a second layer of the getter material on the first substrate, between the magnetically permeable material and the first substrate.

5. The method of claim 4, wherein the cavity is under a substantial portion of a surface of the second layer of the getter material, and wherein the cavity is in fluid communication with the device cavity.

6. The method of claim 1, wherein heating the getter material comprises heating the getter material to a temperature of at least about 400 degrees centigrade.

7. The method of claim 1, further comprising:
   driving the coil with the RF signal at between about 1 kHz and about 100 kHz, with between about 1 watt and 100 watts of RF power.

8. The method of claim 1, further comprising:
   providing a magnetic core around which the coil is wound.

9. The method of claim 1, further comprising:
   energizing the coil with the RF signal of between about 1 watt and 100 watts of RF power, while holding the coil at a distance of about 1 cm from the magnetically permeable material.

10. A device, comprising:
    a magnetically permeable layer material formed on a first substrate;
    a first getter material formed over the magnetically permeable layer material;
    a microdevice formed on the first substrate or a second substrate, the microdevice being encapsulated in a first cavity defined by the first substrate and the second substrate;
    a second cavity disposed in the first substrate under the magnetically permeable layer material, wherein the second cavity is devoid of solid material under a substantial portion of a surface of the magnetically permeable layer material; and a coil which is inductively coupled to the magnetically permeable layer material, but not mechanically or electrically coupled to the first substrate or the second substrate.

11. The device of claim 10, further comprising:
a power supply that provides an RF signal to the coil.

12. The device of claim 10, further comprising:
a magnetic core around which the coil is wound.

13. The device of claim 11, wherein the RF signal has a frequency between about 1 kHz and 100 kHz, and a power level between about 1 watt and 100 watts.

14. The device of claim 10, further comprising:
a second getter material disposed between the first substrate and the magnetically permeable layer material.

15. The device of claim 14, wherein the second cavity disposed under a substantial portion of a surface of the second getter material, and wherein the second cavity is in fluid communication with the first cavity.

16. The device of claim 10, wherein the magnetically permeable layer material comprises at least one of a Ni/Fe alloy, a cobalt alloy and a manganese alloy, and has a permeability of between about 10 and 20 T.

17. The device of claim 10, wherein the first getter material comprises at least one of vanadium, zirconium and iron, and readily absorbs contaminant gases and humidity.

\* \* \* \* \*